(12) United States Patent
Meltzer et al.

(10) Patent No.: US 8,000,671 B2
(45) Date of Patent: Aug. 16, 2011

(54) DUAL THRESHOLD DEMODULATION IN AN AMPLITUDE MODULATION RADIO RECEIVER

(75) Inventors: David Meltzer, Wappinger Falls, NY (US); Gregory A. Blum, Lagrangeville, NY (US); Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 647 days.

(21) Appl. No.: 12/060,775

(22) Filed: Apr. 1, 2008

(65) Prior Publication Data

US 2009/0247100 A1 Oct. 1, 2009

(51) Int. Cl.
*H03G 3/00* (2006.01)

(52) U.S. Cl. ............... 455/234.1; 455/232.1; 455/234.2; 455/240.1; 375/345

(58) Field of Classification Search ............... 455/234.1, 455/232.1, 234.2, 240.1, 130, 235.1, 241.1, 455/245.2, 246.1, 247.1, 249.1, 250.1, 251.1, 455/341, 306, 226.1, 230, 67.11; 375/344–345, 375/301; 330/137–138, 280; 381/102, 104, 381/107–108
See application file for complete search history.

(56) References Cited

U.S. PATENT DOCUMENTS

| | | | |
|---|---|---|---|
| 4,339,728 A | 7/1982 | Monticelli | |
| 4,408,351 A | 10/1983 | Maurer et al. | |
| 4,455,681 A | 6/1984 | Wile | |
| 4,479,266 A | 10/1984 | Eumurian et al. | |
| 4,516,248 A | 5/1985 | Barclay et al. | |
| 4,626,629 A | 12/1986 | Premoli et al. | |
| 4,634,997 A | 1/1987 | Tompsett et al. | |
| 4,653,117 A | 3/1987 | Heck | |
| 5,471,187 A | 11/1995 | Hansen et al. | |
| 5,507,023 A * | 4/1996 | Suganuma et al. | ......... 455/234.1 |
| 5,563,916 A | 10/1996 | Scarpa | |
| 5,617,060 A * | 4/1997 | Wilson et al. | ................. 330/129 |
| 5,917,865 A | 6/1999 | Kopmeiners et al. | |
| 6,118,499 A | 9/2000 | Fang | |
| 6,148,189 A * | 11/2000 | Aschwanden | ............. 455/234.1 |
| 6,560,448 B1 * | 5/2003 | Baldwin et al. | ............ 455/234.1 |
| 6,577,196 B2 | 6/2003 | Hart | |
| 6,608,524 B2 * | 8/2003 | Kawabe et al. | ............... 330/137 |
| 6,654,594 B1 | 11/2003 | Hughes et al. | |
| 6,668,027 B1 | 12/2003 | Scarpa | |
| 6,823,028 B1 | 11/2004 | Phanse | |
| 6,862,327 B2 | 3/2005 | Van Sinderen | |
| 6,952,132 B2 * | 10/2005 | Bhattacharjee et al. | ....... 330/140 |
| 6,954,628 B2 | 10/2005 | Minnis et al. | |

(Continued)

FOREIGN PATENT DOCUMENTS

EP 0926887 A2 6/1999

(Continued)

*Primary Examiner* — Pablo N Tran
(74) *Attorney, Agent, or Firm* — Rosalio Haro

(57) ABSTRACT

A method, algorithm, circuits, and/or systems for demodulation in an amplitude modulated (AM) radio receiver are disclosed. In one embodiment, a radio receiver can include an amplifier configured to receive a radio frequency (RF) input signal and a gain control signal, and provide an amplified signal, an automatic gain control (AGC) circuit configured to receive a high threshold comparator output and provide the gain control signal, a mixer configured to combine the amplified signal and a local oscillation signal and provide a mixed output, a high threshold comparator configured to compare the mixed output with a reference level and provide the high threshold comparator output, and a low threshold comparator configured to compare the mixed output with the reference level and provide an output of the radio receiver.

20 Claims, 6 Drawing Sheets

U.S. PATENT DOCUMENTS

| | | |
|---|---|---|
| 6,977,550 B2 | 12/2005 | Ishida et al. |
| 7,024,172 B1 | 4/2006 | Murphy et al. |
| 7,030,692 B2 * | 4/2006 | Chiu ............................ 330/140 |
| 7,065,336 B2 * | 6/2006 | Spiegel ...................... 455/244.1 |
| 7,099,688 B2 | 8/2006 | Wilson |
| 7,596,192 B2 * | 9/2009 | Furuya .......................... 375/345 |
| 7,630,686 B2 * | 12/2009 | Fukutani et al. ............. 455/63.1 |
| 7,778,613 B2 * | 8/2010 | Seendripu et al. ............ 455/130 |
| 7,782,977 B2 * | 8/2010 | Lee et al. ...................... 375/296 |
| 2004/0146119 A1 | 7/2004 | Weiner et al. |
| 2005/0146643 A1 | 7/2005 | Lee |
| 2006/0094390 A1 | 5/2006 | Pan et al. |

FOREIGN PATENT DOCUMENTS

| | | |
|---|---|---|
| EP | 1552606 B1 | 4/2006 |
| JP | 58-123679 | 8/1983 |
| JP | 04192771 | 7/1992 |
| JP | 06-244754 | 9/1994 |
| JP | 09-247007 | 9/1997 |
| JP | 2004-179948 | 6/2004 |
| JP | 2005311657 | 11/2005 |

* cited by examiner

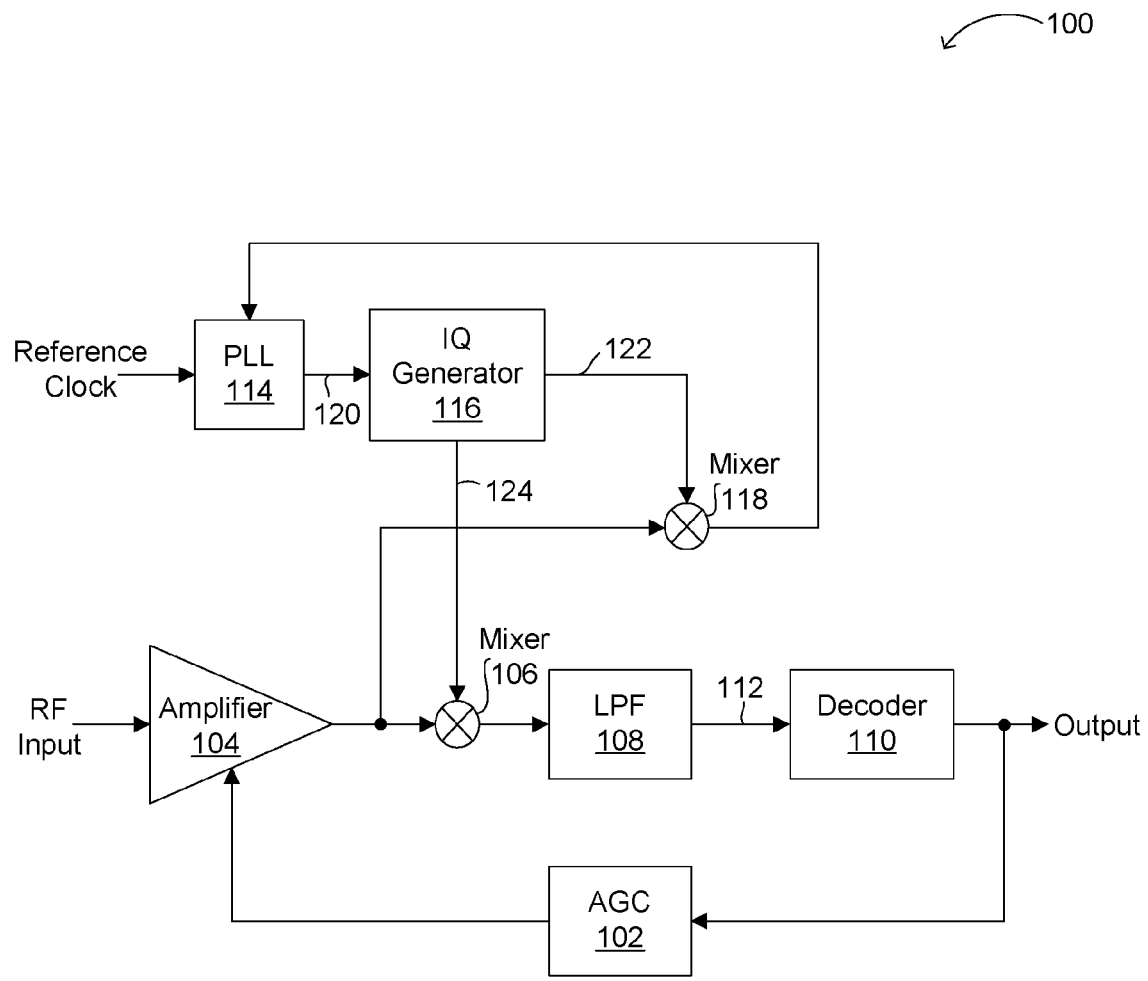
FIG. 1 (conventional)

DUAL THRESHOLD DEMODULATION IN AN AMPLITUDE MODULATION RADIO RECEIVER

FIELD OF THE INVENTION

The present invention generally relates to the field of receiver circuits. More specifically, embodiments of the present invention pertain to methods, circuits, and/or systems for demodulation in an amplitude modulated (AM) radio receiver.

DISCUSSION OF THE BACKGROUND

A radio receiver may be used to recover a "baseband" signal (e.g., a radio signal having a first frequency) from transmitted data (e.g., typically having a second frequency different from, and oftentimes higher than, the first frequency). In some cases, the baseband signal may include frequencies near 0 Hz. For example, in real-time clock applications, the baseband signal frequency is generally about 1 Hz.

In some wireless communication signal systems, transmitted signals can include original low frequency radio signal portions that are modulated to the higher transmitted carrier frequencies (e.g., in a radio-frequency [RF] signal) for transmission. Such original low frequency components (i.e., the baseband radio signal) can then be converted or recovered from the relatively high frequency components by using a radio receiver. In a typical conversion to baseband signal frequencies, one or two mixers or multiplier circuits can be used for a "direct down" conversion approach where incoming data (e.g., a radio signal) is directly converted from the transmission frequency or broadcast channel (e.g., typically from about 40 to about 60 kHz) to the baseband frequency (e.g., about 1 Hz) in a receiver.

Modern AM radio receiver architectures are generally either "heterodyne" or "direct" conversion. For example, heterodyne receivers include generators of new frequencies (e.g., intermediate frequencies [IF]) by mixing two or more signals in a nonlinear device (e.g., a transistor). Typically, direct conversion is preferred for relatively simple baseband demodulation schemes, while IF with a heterodyne receiver is preferred for more complex demodulation schemes. FIG. 1 shows a block level of a conventional direct conversion scheme commonly used for AM demodulation. An AM modulated signal (RF input, e.g., a sine wave) with a "carrier" frequency ($F_c$) is amplified by amplifier 104 (e.g., a low noise amplifier [LNA]), and fed to mixers 106 and 118. Phase locked loop (PLL) 114 is used to generate a local oscillation (LO) signal 120 at the carrier frequency, $F_c$. The IQ generator 116 generates in-phase (I) and quadrature (Q) clocks (e.g., signals 122 and 124, also at frequency $F_c$), which may then be mixed with the amplified RF signal. For example, mixer 118 is used as a phase detector for the PLL loop to enable PLL 114 to synchronize the reference clock with the received RF signal. Further, mixer 106 may produce sum and difference frequencies of the amplified RF input signal and LO signal 120. The low frequency resultant signal (e.g., the difference of the frequencies of the RF input signal and LO signal 120) is the baseband signal 112 of the AM modulation, which may be extracted from the mixer output using a low pass filter (LPF) 108. Thus, LPF 108 may be used to allow the low frequency difference signal to pass through, while blocking the higher frequency summation frequency. Baseband signal 112 may then be converted into a digital signal using decoder 110. Further, the gain of amplifier 104 can be adjusted using automatic gain control (AGC) circuit 102 in order to obtain a more faithful reproduction of the transmitted baseband signal.

FIG. 2 shows decoder input (signal 112) and output signals for the conventional direct conversion scheme of FIG. 1. As shown, threshold 202 (along with the slew rate of signal 112) determines the duty cycle of the decoder output digital signal relative to the decoder input waveform. Typically, a CMOS inverter or buffer is used as a decoder, where the amplitude of the input signal to the decoder has to be relatively large in order to improve performance. Thus, a larger gain along the signal path from amplifier 104 to LPF 108 may also be needed to generate a suitably large amplitude at input signal 112. Generating such larger signal gains generally results in increased power consumption in the system. Therefore, such a conventional approach may not be desirable in power sensitive applications, such as handheld devices.

SUMMARY OF THE INVENTION

Embodiments of the present invention relate to methods, algorithms, circuits, and/or systems for demodulation in an amplitude modulated (AM) radio receiver.

In one embodiment, a radio receiver can include an amplifier configured to receive a radio frequency (RF) input signal and a gain control signal, and provide an amplified signal, an automatic gain control (AGC) circuit configured to receive a high threshold comparator output and provide the gain control signal, a mixer configured to combine the amplified signal and a local oscillation signal and provide a mixed output, a high threshold comparator configured to compare the mixed output with a reference level and provide the high threshold comparator output, and a low threshold comparator configured to compare the mixed output with the reference level and provide an output of the radio receiver.

In one embodiment, an AGC loop circuit can include an amplifier configured to receive an RF input signal and a gain control signal, and provide an amplified signal, an AGC block configured to receive a high threshold comparator output and provide the gain control signal, a mixer configured to combine the amplified signal and a local oscillation signal and provide a mixed output, a filter configured to receive the mixed output and provide a baseband signal therefrom, where the baseband signal is converted into a digital recovered baseband signal by a low threshold comparison of the baseband signal with a reference level, and a high threshold comparator configured to compare the baseband signal with the reference level, and provide the high threshold comparator output.

In another embodiment, a method of demodulating an RF input signal can include receiving the RF input signal in an amplifier of a radio receiver, combining an output of the amplifier with a local oscillation signal to form a first signal, performing a high threshold comparison of the first signal with a reference level to provide a second signal, the second signal providing gain control for the amplifier, and performing a low threshold comparison of the first signal with the reference level to provide digital recovered baseband signal from the RF input signal.

Embodiments of the present invention can advantageously provide a reliable and simplified AM demodulation approach that utilizes dual threshold comparators suitable for use in low power applications. These and other advantages of the present invention will become readily apparent from the detailed description of preferred embodiments below.

BRIEF DESCRIPTION OF THE DRAWINGS

FIG. 1 is a block level diagram showing a conventional direct conversion scheme commonly used for AM demodulation.

DETAILED DESCRIPTION OF THE PREFERRED EMBODIMENTS

Figure 2:
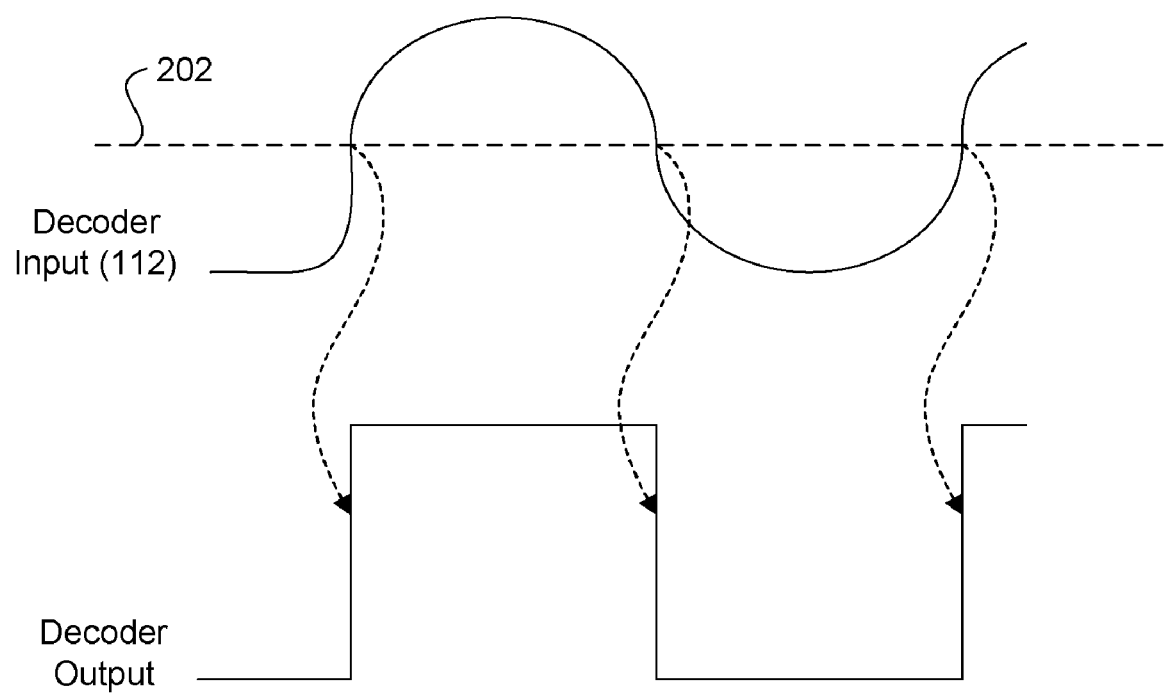
FIG. 2 is a waveform diagram showing decoder input and output signals for the conventional direct conversion scheme of FIG. 1.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with" (which may refer to direct or indirect connections, couplings, or communications), but these terms are also generally given their art-recognized meanings herein.

The present invention relates to hardware, firmware and software implementations of the present structure, method and circuit. Embodiments of the present invention can advantageously provide a reliable and simplified amplitude modulated (AM) demodulation approach that utilizes dual threshold comparators, and is particularly suitable for low power applications. Further, embodiments of the present invention use an automatic gain control (AGC) circuit to control an amplifier gain from an output from one comparator, while an output from another comparator provides a radio receiver output. The invention, in its various aspects, will be explained in greater detail below with regard to exemplary embodiments.

According to various embodiments of the present invention, a radio receiver can include an amplifier, a first comparator to provide an AGC circuit input, and a second comparator to provide a demodulated signal output from the radio receiver. A target application for the particular example circuitry shown herein is an AM radio receiver, of either direct conversion or heterodyne type, where the AM data may be communicated as a radio frequency (RF) sine wave. In one embodiment, an amplifier output is mixed with a local oscillation signal, filtered, and then supplied to each of the comparators. Of course, other types of circuits and/or digital logic blocks can also be utilized in specific embodiments.

An Exemplary Radio Receiver

An exemplary radio receiver according to the invention includes (i) an amplifier configured to receive an RF input signal and a gain control signal, and provide an amplified signal; (ii) an AGC circuit, configured to receive a high threshold comparator output and provide the gain control signal; (iii) a mixer, configured to combine the amplified signal and a local oscillation signal and provide a mixed output; (iv) a high threshold comparator configured to compare the mixed output with a reference level, and provide the high threshold comparator output; and (v) a low threshold comparator configured to compare the mixed output with the reference level, and provide an output of the radio receiver.

Figure 3:
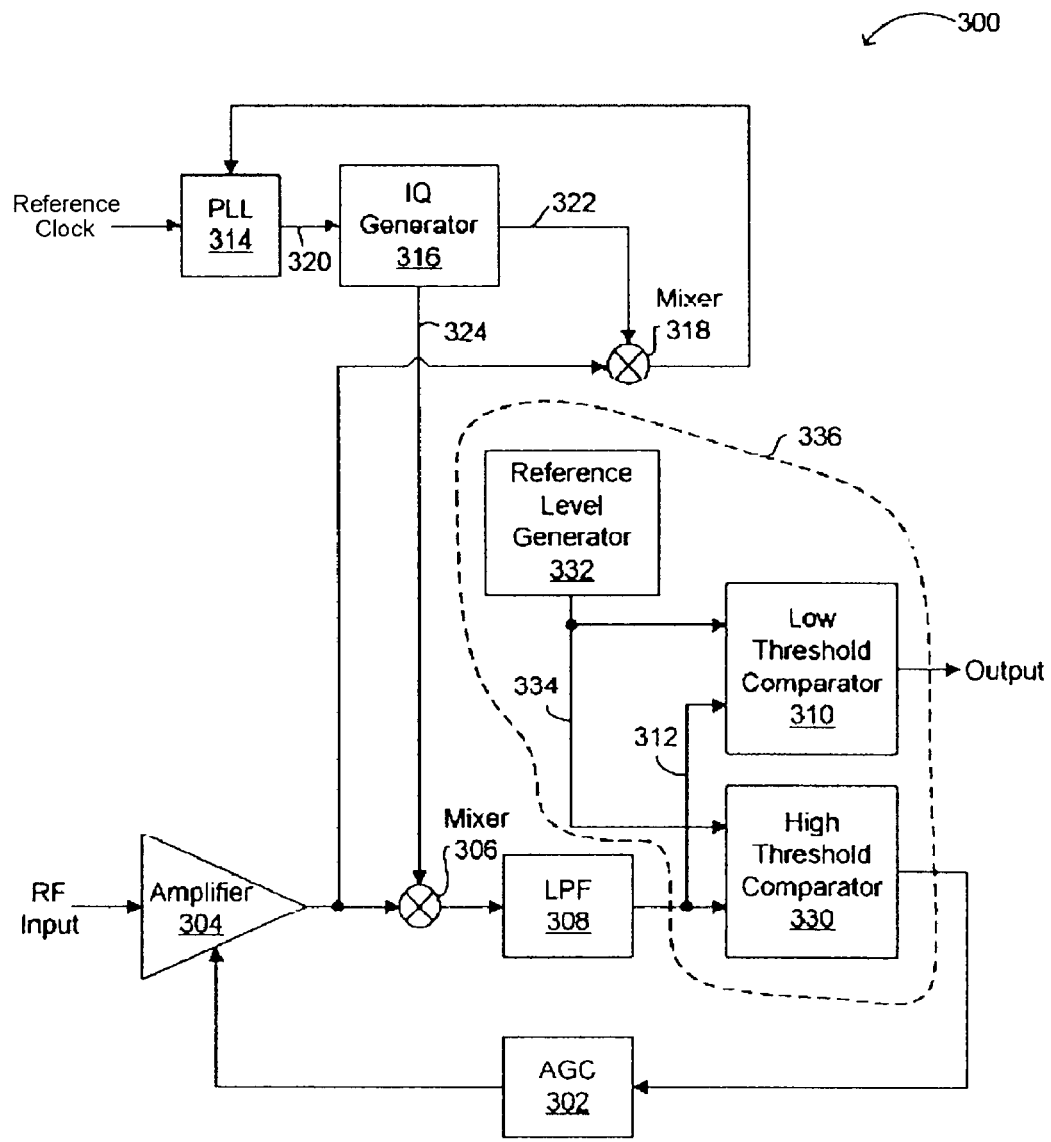
FIG. 3 is a block level diagram showing a dual threshold direct conversion scheme in accordance with embodiments of the present invention.

FIG. 3 shows an exemplary dual threshold direct conversion AM receiver 300 in accordance with embodiments of the present invention. An AM modulated signal (RF input) with a carrier frequency ($F_c$) may be amplified by amplifier 304 (e.g., a low noise amplifier [LNA]), and supplied to mixers 306 and 318. A phase locked loop (PLL) 314 may be used to generate a local oscillation (LO) signal 320 having a frequency at or about equal to the carrier frequency, $F_c$, or an integer multiple and/or fraction thereof. The IQ generator 316 can generate in-phase (I) and quadrature (Q) clocks (e.g., signals 322 and 324, also each at or about equal to the carrier frequency $F_c$, but 90° out of phase with each other, which can then be mixed with the amplified RF signal using mixers 306 and 318, respectively. IQ generator 316 may be generally conventional, and in one embodiment, it may be an exemplary I/Q generator as disclosed in U.S. patent application Ser. No. 11/740,159, filed Apr. 25, 2007, the relevant portion(s) of which are incorporated herein by reference.

Mixer 318 may be used as a phase detector for the PLL loop to enable PLL 314 to synchronize the reference clock with the received RF signal (e.g., via amplifier 304). Mixer 306 may produce sum and difference frequencies of the amplified RF input signal and LO signal 320 (e.g., via signal 324). The resultant low frequency signal (e.g., a signal having a frequency that is the difference of the amplified RF input signal and LO signal 320) may be the baseband signal of the AM modulation. This baseband signal 312 can be extracted from the mixer output using a low pass filter (LPF) 308 (e.g., by filtering out the higher frequency summation signal[s]), and may then be converted into a digital signal using high threshold comparator 330. The gain of amplifier 304 can also be adjusted using AGC circuit block 302 in order to obtain a faithful reproduction of the transmitted baseband signal. AGC circuit block 302 may be generally conventional, and in one embodiment, it may be an AGC circuit that includes digital gain logic and lock detection logic as disclosed in U.S. patent application Ser. No. 11/877,447, filed Oct. 23, 2007, the relevant portions of which are incorporated herein by reference.

In dual threshold comparator block 336, each of two decoders or other, functionally equivalent digital logic can be implemented as a fixed reference comparator (e.g., comparators 310 and 330). Other types of decoders and/or comparators (e.g., differential amplifiers, variable reference level comparators, dynamic precharged logic, etc.) can also be used in certain embodiments. In the fixed reference comparator example of FIG. 3, reference level 334 is generated from a reference level generator 332, and coupled to each of comparators 310 and 330. The high threshold comparator 330 may be used as part of the AGC loop (e.g., amplifier 304, mixer 306, LPF 308, high threshold comparator 330, and AGC block 302). In this fashion, high threshold comparator 330 can recognize baseband signal 312, and help to maintain lock of the AGC loop (e.g., via AGC block 302 controlling a gain of amplifier 304) even when a duty cycle of the output of high threshold comparator 330 correlates in a less-than-ideal manner to the duty cycle of baseband signal 312.

The low threshold comparator 310 can be used to generate a baseband signal representation for an outside interface (e.g., via signal Output). Locking the AGC loop can ensure that the gain of amplifier 304 is appropriately adjusted such that the high threshold comparator 330 transitions, and the low threshold comparator 310 also switches accordingly. By properly setting the threshold for the low threshold comparator 310, the baseband signal can be recovered in digital form at the receiver output, and with good duty cycle correlation to baseband signal 312. In order to properly set the thresholds in given applications for both low threshold comparator 310 and high threshold comparator 330, user-programmable adjustments can be made (e.g., via metal options or register-based controls). For example, product characterization of an integrated circuit including the present AM receiver 300 (or the exemplary AM receiver 600 of FIG. 6 infra) may include enabling and/or disabling one or more resistor, capacitor, and/or transistor segments or devices (e.g., programmed memory bits) in order to appropriately adjust and set the high and low comparator threshold levels. Further, reference level generator 332 may also provide a similarly user-adjustable reference level 334.

Figure 4:
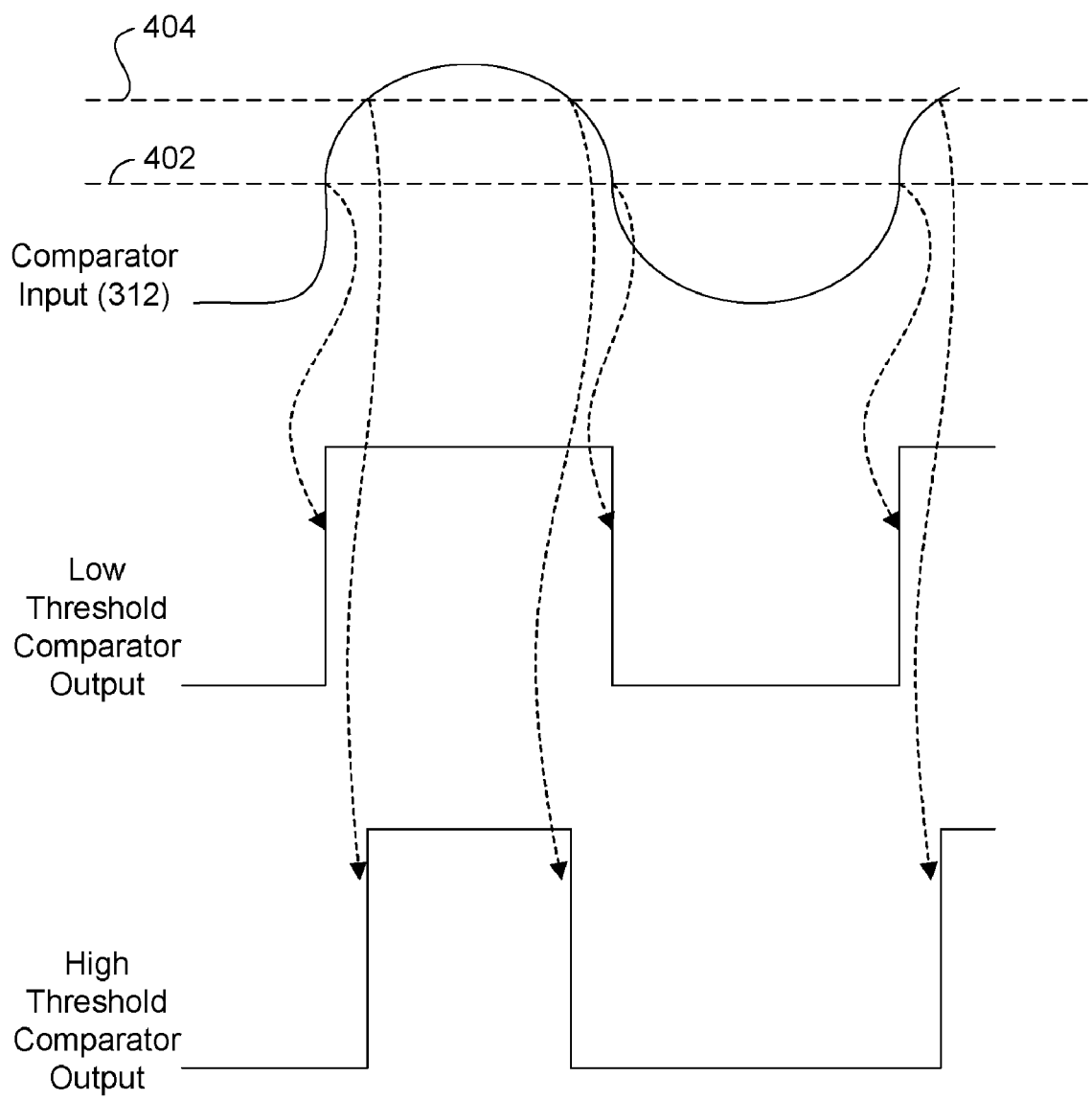
FIG. 4 is a waveform diagram showing thresholds and input/output signals for the comparators of FIG. 3.

FIG. 4 shows waveforms of thresholds (e.g., low threshold 402 and high threshold 404) and input/output signals for both comparators (e.g., 310 and 330) of FIG. 3. A stable output can be provided from the low threshold comparator (e.g., 310) when the AGC loop is locked. Such a low threshold comparator output can have relatively good duty cycle correlation with baseband signal (comparator input) 312. Comparators 310 and 330 do not necessarily require a large amplitude input signal (e.g., at baseband signal 312) in order to reproduce the baseband signal at the receiver output.

However, as mentioned above, both the low threshold comparator 402 and high threshold comparator 404 must make similar, corresponding transitions, where the rising or falling transitions in each comparator have substantially the same period. Thus, the high threshold comparator output is included in the AGC loop (including the amplifier 304), and the low threshold comparator output automatically switches by design. As a result, the various gains in the signal path from amplifier 304 to LPF 308 (e.g., to drive baseband signal 312), which can be controlled by the length of time that the high threshold comparator output is in a predetermined state (e.g., high), may be lower than conventional approaches. As a result of the reduced gain, the overall system may draw less power, making certain embodiments particularly suitable for low power applications, such as battery-operated wireless devices (e.g., radio watches and real-time clocks, cell phones, personal digital assistants, laptop computers, etc.). Thus, the threshold of the low threshold comparator 402 is generally optimized for duty cycle (50% duty cycle being ideal, in one example), and high threshold comparator 404 is generally optimized for reduced power consumption. Further, this approach can also be utilized in heterodyne AM receiver architectures.

An Exemplary Method of Demodulation

An exemplary method of demodulating an RF input signal includes the steps of (i) receiving the RF input signal in an amplifier of a radio receiver; (ii) combining an output of the amplifier with a local oscillation signal to form a first signal; (iii) performing a high threshold comparison of the first signal with a reference level to provide a second signal, the second signal providing gain control for the amplifier; and (iv) performing a low threshold comparison of the first signal with the reference level to provide a digital recovered baseband signal from the RF input signal.

Figure 5:
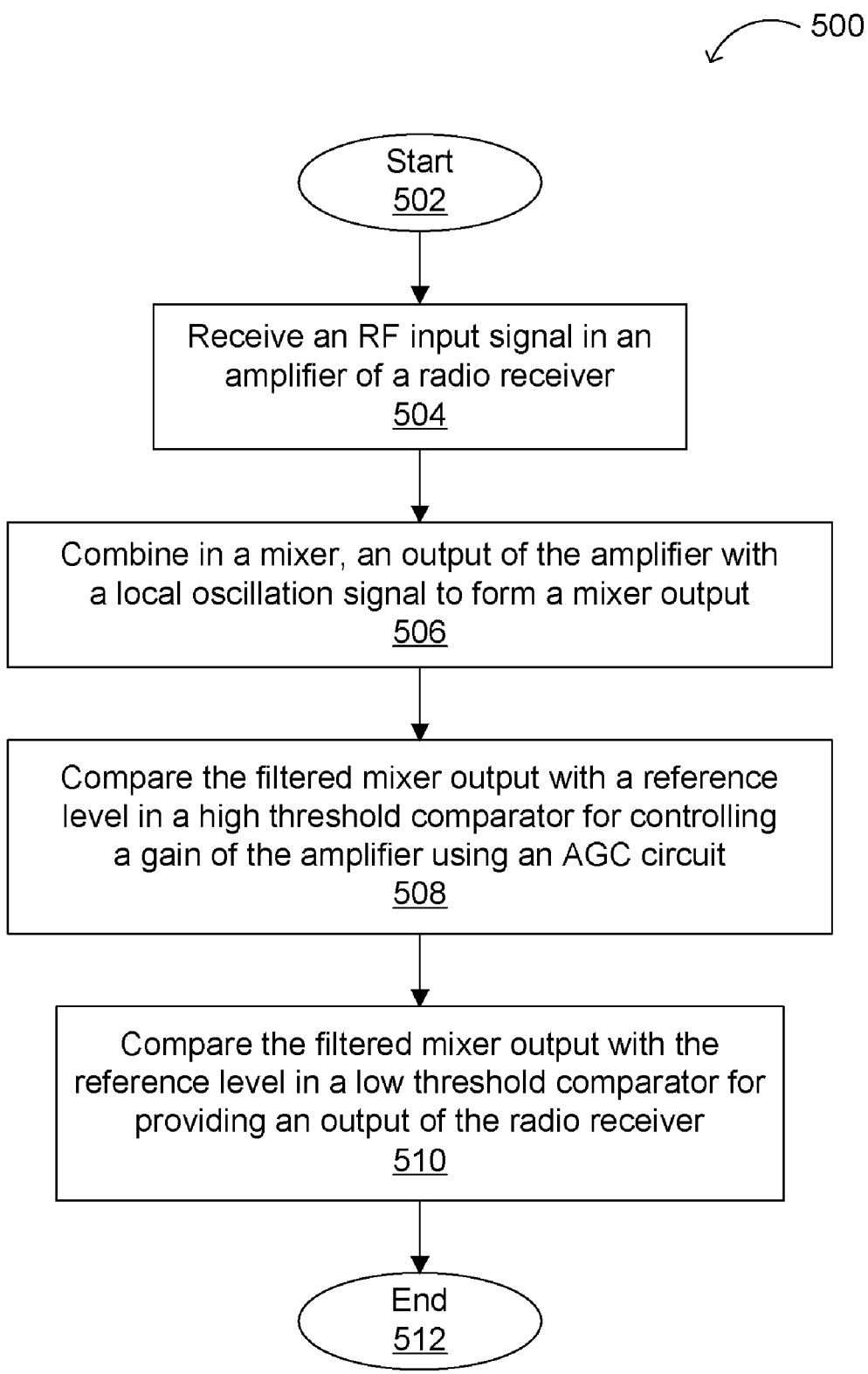
FIG. 5 is a flow diagram showing an exemplary method of demodulation using dual thresholds in accordance with embodiments of the present invention.

FIG. 5 shows a flow diagram of an exemplary method of demodulation 500 using dual thresholds (e.g., high and low) in accordance with embodiments of the present invention. The flow can begin (502), and an RF input signal can be received in an amplifier (e.g., an LNA) of an AM radio receiver (504), such as a direct conversion or heterodyne type receiver. A mixer (e.g., mixer 306) can be used to combine an output of the amplifier with a local oscillation signal (e.g., signal 324) to form a mixer output (506). This mixer output may be filtered (e.g., using LPF 308; see FIG. 3) to separate a frequency difference mixer output (e.g., the desired baseband signal) from a frequency summation mixer output. Alternatively, the mixer output may be directly coupled to the dual threshold comparators, or coupled via another type of filter (e.g., a bandpass filter, a high pass filter [HPF], etc.) in other applications.

The mixer output (or a filtered version thereof, see step 508 in FIG. 5) provides a baseband signal (e.g., 312), and can be compared with a reference level in a high threshold comparator for controlling a gain of the amplifier (step 508). For example, the amplifier gain can be controlled using an AGC circuit as part of an AGC loop structure (e.g., amplifier 304, mixer 306, LPF 308, high threshold comparator 330, and AGC 302; see FIG. 3). The mixer output can also be compared with the common reference level in a low threshold comparator for providing output of the radio receiver and recovering the baseband signal (see step 510 in FIG. 5), preferably with a predetermined duty cycle, thus completing the flow (512).

An Alternative Radio Receiver

Figure 6:
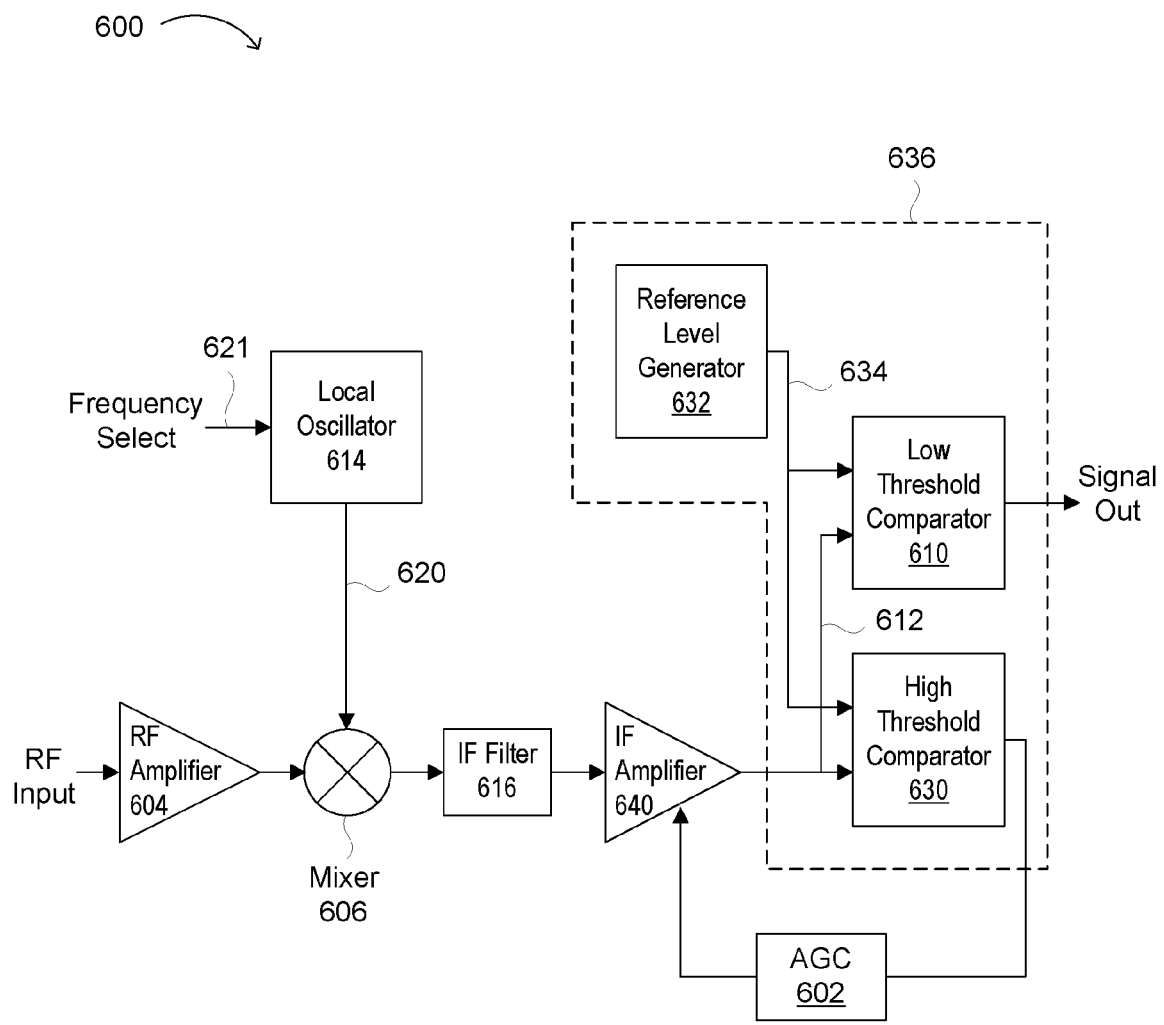
FIG. 6 is a block level diagram showing a dual threshold heterodyne receiver in accordance with embodiments of the present invention.

FIG. 6 shows a block level diagram of an exemplary dual threshold heterodyne receiver 600 in accordance with embodiments of the present invention. In a heterodyne receiver, an AM radio signal to be received is converted to a common intermediate (IF) frequency ($F_{IF}$) by mixing the incoming RF signal with a locally generated signal having a frequency equal to that of the carrier frequency of the incoming RF signal minus the IF frequency, e.g., 455 kHz. This conversion allows the use of a single-tuned IF amplifier for signals from any radio station in the frequency band. The IF amplifier may be designed to have a bandwidth of, e.g., about 10 kHz, thus matching the bandwidth of the transmitted signal. Alternatively, the IF amplifier may be designed to have a wider bandwidth.

In the particular example of FIG. 6, an AM modulated signal (RF input) with a carrier frequency ($F_c$) may be amplified by RF amplifier 604, and supplied to mixer 606. Here, local oscillator 614 may be used to generate a local oscillation (LO) signal 620 at about the carrier frequency ($F_c$) minus the IF frequency ($F_{IF}$). Local oscillator 614 may be a simple variable frequency oscillator or, alternatively, a PLL. The frequency to be generated by local oscillator 614 is controlled by a frequency select input 621. Frequency conversion to IF may be performed by the combination of RF amplifier 604 and mixer 606. RF amplifier 604 may be a wide-bandwidth RF amplifier capable of providing amplification at all frequencies to be received, or a narrow-bandwidth amplifier which is tuned to the signal to be received. Tuning for a desired RF frequency in the case of a narrow-bandwidth amplifier may be provided, e.g., by a variable capacitor in the RF amplifier 604.

Mixer 606 may produce a plurality of signals represented by the sum(s) and difference(s) of the frequencies of the amplified RF input signal and the LO signal 620. Only the resultant low frequency signal may be passed (e.g., using a low-pass or band-pass IF filter portion 616) and amplified using IF amplifier 640 to provide an amplified IF signal of the AM modulation. Amplified IF signal 612 can then be converted into a digital signal using high threshold comparator 630, and the gain of IF amplifier 640 can be adjusted using AGC block 602, which can be substantially the same as AGC block 302 of FIG. 3.

In dual threshold comparator block 636 of FIG. 6, each of two decoders or other, functionally equivalent digital logic can be implemented as a fixed reference comparator (e.g., comparators 610 and 630). Other types of decoders and/or comparators (e.g., differential amplifiers, variable reference level comparators, dynamic precharged logic, etc.) can also be used in certain embodiments. In the fixed reference comparator example of FIG. 6, reference level 634 is generated from a reference level generator 632, and is then coupled to each of comparators 610 and 630. The high threshold comparator 630 may be used as part of the AGC loop (e.g., IF amplifier 640, high threshold comparator 630, and AGC block 602, and optionally, RF amplifier 604 and mixer 606 when the output of AGC block 602 is provided to RF amplifier 604). In this fashion, the high threshold comparator 630 can recognize the amplified IF signal 612, and maintain lock of the AGC loop (e.g., via AGC block 602 controlling a gain of IF amplifier 640) even when a duty cycle of the output of high threshold comparator 630 poorly correlates to that of amplified IF signal 612.

The low threshold comparator 610 can be used to generate an IF signal representation for an outside interface (e.g., via signal Output). The signal Output can then be used to recover the baseband signal from the IF using an IF demodulator, e.g. a diode detector. Locking the AGC loop can ensure that a gain of IF amplifier 640 is appropriately adjusted such that when the high threshold comparator 630 transitions, the low threshold comparator 610 also switches accordingly. By properly setting the threshold for the low threshold comparator 610, the IF signal can be recovered in digital form at the receiver output, and with good duty cycle correlation to amplified IF signal 612. In order to properly set the thresholds in given applications for both low threshold comparator 610 and high threshold comparator 630, user-programmable adjustments can be made (e.g., via metal options or register-based controls). For example, product characterization may include enabling or disabling resistor, capacitor, and/or transistor segments or devices in an integrated circuit including the present AM receiver 600 in order to appropriately adjust and set the high and low comparator threshold levels (see, e.g., FIG. 4 and the corresponding discussion thereof supra). Further, reference level generator 632 may also provide a similarly user-adjustable reference level 634, or multiple such independent reference levels.

CONCLUSION

While the above examples generally show direct conversion and heterodyne AM radio receiver implementations, one skilled in the art will recognize that other implementations and/or technologies may also be used in accordance with various embodiments of the invention. Further, one skilled in the art will recognize that current-based differential signaling and/or control may also be used in accordance with such embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A radio receiver, comprising:
   a) an amplifier configured to receive a radio frequency (RF) input signal and a gain control signal, and provide an amplified signal;
   b) a mixer, configured to combine said amplified signal and a local oscillation signal and provide a mixed output;
   c) a first threshold comparator configured to compare a baseband signal with a first comparator threshold level, and provide a first comparator output, said baseband signal being derived from said mixed output;
   d) a second threshold comparator configured to compare said baseband signal with a second comparator threshold level, and provide a second comparator output coupled to an output of said radio receiver, said second comparator threshold level being of lower magnitude than said first comparator threshold level;
   e) an automatic gain control (AGC) circuit, configured to receive said first comparator output and provide said gain control signal.

2. The radio receiver of claim 1, further comprising a phase locked loop (PLL) configured to generate said local oscillation signal from a reference clock.

3. The radio receiver of claim 1, further comprising a low pass filter (LPF) coupled to said mixed output, and configured to provide said baseband signal to said first threshold comparators and to said second threshold comparator.

4. The radio receiver of claim 1, wherein said RF input signal includes an amplitude modulated (AM) signal.

5. The radio receiver of claim 1, wherein the frequency of said local oscillation signal is substantially equal to a carrier frequency of said RF input signal.

6. The radio receiver of claim 1, wherein said first comparator output has a lower duty cycle than said second comparator output.

7. The radio receiver of claim 1, wherein said first comparator threshold level and said second comparator threshold level are adjustable.

8. An automatic gain control (AGC) loop circuit, comprising:
   a) an amplifier configured to receive a radio frequency (RF) input signal and a gain control signal, and provide an amplified signal;
   b) a mixer, configured to combine said amplified signal and a local oscillation signal and provide a mixed output;
   c) a filter configured to receive said mixed output and provide a baseband signal therefrom, said baseband signal being converted into a digital, recovered, baseband signal by a comparison of said baseband signal with a first threshold level;
   d) a threshold comparator configured to compare said baseband signal with a second threshold level higher than said first threshold level, and to provide a threshold comparator output;
   e) an AGC block configured to receive said threshold comparator output and generate said gain control signal therefrom.

9. The circuit of claim 8, configured for heterodyne type demodulation of said RF input signal.

10. The circuit of claim 8, wherein said digital, recovered, baseband signal has a higher duty cycle than said threshold comparator output.

11. The circuit of claim 8, wherein said first threshold level and second threshold level are adjustable.

12. A method of demodulating a radio frequency (RF) input signal, comprising the steps of:
   a) receiving said RF input signal in an amplifier of a radio receiver;
   b) mixing an output of said amplifier with a local oscillation signal to form a mixed signal;
   c) obtaining a recovered signal from said mixed signal;
   d) performing a first comparison of said recovered signal with a first reference threshold level to provide a first signal, said first signal providing gain control for said amplifier; and
   e) performing a second comparison of said recovered signal with a second reference threshold level to provide a digital, recovered, baseband signal, wherein said first reference threshold level is higher than said second reference threshold level.

13. The method of claim 12, wherein in step (c), said recovered signal is obtained by applying said mixed signal to a frequency filter.

14. The method of claim 12, further comprising adjusting said second reference threshold level to maintain a 50% duty cycle on said digital, recovered, baseband signal.

15. A radio receiver, comprising:
   a) a first amplifier configured to receive a radio frequency (RF) input signal and provide an amplified signal;
   b) a mixer configured to combine said amplified signal and a local oscillation signal and provide a mixed output;
   c) a second amplifier configured to receive said mixed output and provide an intermediate frequency (IF) signal;
   d) a first threshold comparator configured to compare said IF signal with a first reference threshold level, and provide a first comparator output; and
   e) a second threshold comparator configured to compare said IF signal with a second reference threshold level, and provide a second comparator output coupled to an output of said radio receiver.

16. The radio receiver of claim 15, further comprising an automatic gain control (AGC) circuit configured to receive said first comparator output and produce a gain control signal.

17. The radio receiver of claim 16, wherein said second amplifier is further configured to receive said gain control signal.

18. The radio receiver of claim 17, further comprising a phase locked loop (PLL) and an in-phase and quadrature signal generator configured to generate said local oscillation signal from a reference clock.

19. The radio receiver of claim 15, wherein said second amplifier further comprises one or more filters configured to filter said mixed output.

20. The radio receiver of claim 15, further comprising one or more reference level generators configured to produce one or more of said reference threshold levels.

* * * * *

UNITED STATES PATENT AND TRADEMARK OFFICE
CERTIFICATE OF CORRECTION

| | | |
|---|---|---|
| PATENT NO. | : 8,000,671 B2 | Page 1 of 1 |
| APPLICATION NO. | : 12/060775 | |
| DATED | : August 16, 2011 | |
| INVENTOR(S) | : Meltzer et al. | |

It is certified that error appears in the above-identified patent and that said Letters Patent is hereby corrected as shown below:

Column 9,
Line 30, please change "comparators" to --comparator--.

Signed and Sealed this
Twenty-second Day of November, 2011

David J. Kappos
*Director of the United States Patent and Trademark Office*